United States Patent
Farkas et al.

(10) Patent No.: US 8,263,430 B2
(45) Date of Patent: Sep. 11, 2012

(54) CAPPING LAYER FORMATION ONTO A DUAL DAMESCENE INTERCONNECT

(75) Inventors: Janos Farkas, Saint Ismier (FR); Lynne M Michaelson, Austin, TX (US); Srdjan Kordic, Biviers (FR)

(73) Assignees: NXP B.V., Eindhoven (NL); Freescale Semiconductor, Inc., Austin, TX (US)

( * ) Notice: Subject to any disclaimer, the term of this patent is extended or adjusted under 35 U.S.C. 154(b) by 1229 days.

(21) Appl. No.: 12/065,190

(22) PCT Filed: Sep. 1, 2005

(86) PCT No.: PCT/EP2005/011128
§ 371 (c)(1),
(2), (4) Date: Feb. 28, 2008

(87) PCT Pub. No.: WO2007/025566
PCT Pub. Date: Mar. 8, 2007

(65) Prior Publication Data
US 2008/0242110 A1    Oct. 2, 2008

(51) Int. Cl.
*H01L 51/56* (2006.01)
(52) U.S. Cl. ............... 438/99; 257/40; 257/E51.025
(58) Field of Classification Search ............... 257/40, 257/E51.025; 438/99
See application file for complete search history.

(56) References Cited

U.S. PATENT DOCUMENTS

| | | | |
|---|---|---|---|
| 5,358,743 A | 10/1994 | Hampden-Smith et al. | |
| 5,478,436 A | 12/1995 | Winebarger et al. | |
| 5,614,444 A | 3/1997 | Farkas et al. | |
| 6,127,282 A | 10/2000 | Lopatin | |
| 6,268,432 B1 * | 7/2001 | Nakata et al. | 524/588 |
| 6,503,834 B1 | 1/2003 | Chen et al. | |
| 6,660,338 B1 * | 12/2003 | Hargreaves | 427/399 |
| 6,660,634 B1 | 12/2003 | Ngo et al. | |
| 6,860,944 B2 | 3/2005 | Ivanov et al. | |

(Continued)

FOREIGN PATENT DOCUMENTS

JP    2001115022    * 10/1999

(Continued)

*Primary Examiner* — Kiesha Bryant
*Assistant Examiner* — Ali Naraghi

(57) ABSTRACT

A process for the formation of a capping layer on a conducting interconnect for a semiconductor device is provided, the process comprising the steps of: (a) providing one or more conductors in a dielectric layer, and (b) depositing a capping layer on an upper surface of at least some of the one or more conductors, characterized in that the process further includes: (c) the step of, prior to depositing the capping layer, reacting the dielectric layer with an organic compound in a liquid phase, the said organic compound having the following general formula: (I) where X is a functional group, R is an organic group or a organosiloxane group, Y1 is either a functional group or an organic group or organosiloxane group, and Y2 is either a functional group or an organic group or organosiloxane group, and where the functional group(s) is/are independently selected from the following: NH2, a secondary amine, a tertiary amine, acetamide, trifluoroacetamide, imidazole, urea, OH, an alkyoxy, acryloxy, acetate, SH, an alkylthiol, sulfonate, methanosulfonate, and cyanide, and salts thereof.

(Formula I)

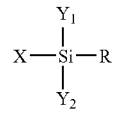

36 Claims, 2 Drawing Sheets

Figure 1:
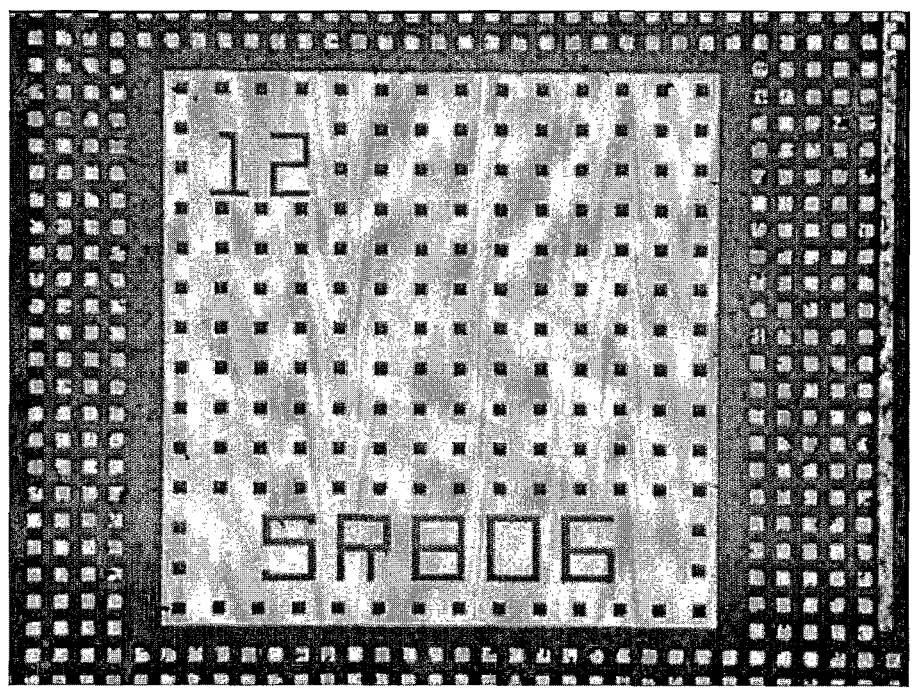

Photograph of the surface of example 1 after electroless deposition of a capping layer.

U.S. PATENT DOCUMENTS

| | | |
|---|---|---|
| 6,924,232 B2 | 8/2005 | Mathew et al. |
| 7,749,920 B2 * | 7/2010 | Sakurai et al. ............... 438/778 |
| 2001/0018266 A1 | 8/2001 | Jiang et al. |
| 2005/0029662 A1 | 2/2005 | Nakano et al. |
| 2005/0048773 A1 | 3/2005 | Mathew et al. |
| 2005/0049382 A1 * | 3/2005 | Lyu et al. ...................... 528/35 |
| 2006/0012079 A1 * | 1/2006 | Jung et al. ..................... 264/338 |
| 2006/0108576 A1 * | 5/2006 | Laermer et al. ................ 257/40 |
| 2008/0303019 A1 * | 12/2008 | Nakagawa et al. ............ 257/40 |

FOREIGN PATENT DOCUMENTS

| | | |
|---|---|---|
| WO | 2004/006305 A1 | 1/2004 |

* cited by examiner

Photograph of the surface of comparative example 1 after electroless deposition of a capping layer.

Photograph of the surface of example 1 after electroless deposition of a capping layer.

CAPPING LAYER FORMATION ONTO A DUAL DAMESCENE INTERCONNECT

The present invention relates to the deposition of a capping layer on a conducting interconnect in a dielectric layer for a semiconductor device. More particularly, the present invention relates to the treatment of the dielectric layer prior to the deposition of the capping layer.

Semiconductor manufacturers are continuously striving to produce faster and more complex integrated circuits. One way to achieve this is to reduce the dimensions of the semiconductor circuits, thereby decreasing the gate (transistor) delay. However, as the dimensions of the circuits are reduced, the physical properties of the materials making up the circuits become increasingly important. In particular, as the size of the conducting interconnects contained in the circuit, and more particularly their width, decreases, the electrical resistance of the interconnect is proportionately increased. This causes an increased interconnect time delay. Until recently, aluminium had been traditionally used to manufacture these interconnects. However, in order to combat the problems associated with the reduction in the circuit dimensions, semiconductor manufacturers have decided that copper provides better material characteristics than aluminium for use in interconnects because of its lower bulk resistivity, higher heat conductivity and higher melting point, which results in improved speed and reliability performance. In addition, copper also has lower rate of grain boundary diffusion, and therefore higher electromigration resistance.

Copper interconnects have their own associated problems. Copper interconnects still have a tendency to be degraded by diffusion and electromigration. A passivating dielectric layer, typically 30 to 50 nanometres thick, is usually applied to the exposed top surface of the copper interconnect. An example of such a dielectric used in this role is SiCN. However, copper suffers from poor adhesion to dielectrics, and at the moment it is the dielectric/copper interface which is one of the main limiting factors in the reliability of the final semiconductor device. In addition, dielectrics such as SiCN have a high dielectric constant (k value), and therefore their presence adds to the k value of the dielectric stack of the final semiconductor device. This is also undesirable.

In order to combat these problems, a thin capping layer comprising a metal, typically a metallic alloy, may be deposited on the copper interconnects instead of a more common dielectric such as SiCN. The capping layer is also known as a passivation layer.

It will be appreciated that, although the problems of poor adhesion and electromigration have been described in the context of copper, interconnects made from other materials which suffer from the same problems, may also benefit from such a capping layer for the same reasons.

Techniques used to deposit the capping layer comprising the metal onto the interconnect, such as electro-less deposition, are generally selective in nature, in that they deposit the capping layer onto the interconnect but not onto the dielectric surface. However, the selectivity and effectiveness of these techniques is limited by the existence of defects on the dielectric surface. These defects can cause the formation of bridges during the deposition of the capping layer between two neighbouring interconnects, thereby resulting in unwanted electronic communication between the interconnects, short circuiting the device and ultimately causing device failure. These defects include defects inherent to the dielectric surface. An example of an inherent defect is micro-scratches on the surface, which may initiate the deposition of the capping material on the dielectric surface. In addition, small areas of metal or metallic oxide residues on the surface may also be considered inherent defects. These areas may originate, for example, from the patterning and deposition of the conducting material forming the interconnects onto the surface.

For the case where the capping layer is deposited from an electroless bath solution, these defects may further include contaminants deposited onto the surface from the reaction solution.

When the surface has undergone polishing, such as Chemical Mechanical Polishing, after the deposition of the interconnect, as is usual when copper is used for the interconnects, there may be additional causes for these defects. Firstly, inherent defects on the surface may be formed from small areas of metal or metallic oxide residues that have not been removed from the surface. The deposition of the capping material may be enhanced on these areas. The defects may also include residual particles from the polishing slurry remaining on the surface.

One approach to reduce the impact of the defects is described in U.S. Pat. No. 5,478,436. This describes a cleaning process after electro-less deposition in which residual particles and contaminants on the dielectric surface after the electro-less deposition process are removed by a brushing process.

Previous approaches to the cleaning of the dielectric and interconnect surfaces prior to deposition of the capping layer have included washing with both inorganic acids and bases. However, the effectiveness of these processes is limited. Two other approaches are described in U.S. Pat. No. 6,860,944 and US2001/0018266.

U.S. Pat. No. 5,358,743 describes the treatment of a dielectric surface with $ClSi(CH_3)_3$. The treatment is undertaken prior to deposition of a copper interconnect structure in order to increase the selectivity of the copper deposition through Chemical Vapour Deposition.

Accordingly, in a first aspect the present invention provides a process for the formation of a capping layer on a conducting interconnect for a semiconductor device, the process comprising the steps of:
(a) providing one or more conductors in a dielectric layer, and
(b) depositing a capping layer on an upper surface of at least some of the one or more conductors,
   characterised in that the process further includes:
(c) the step of, prior to depositing the capping layer, reacting the dielectric layer with an organic compound in a liquid phase, the said organic compound having the following general formula:

(Formula I)

where X is a functional group, R is an organic group or a organosiloxane group, $Y_1$ is either a functional group or an organic group or organosiloxane group, and $Y_2$ is either a functional group or an organic group or organosiloxane group, and where the functional group(s) is/are independently selected from the following: $NH_2$, a secondary amine, a tertiary amine, acetamide, trifluoroacetamide, imidazole, urea, OH, an alkyoxy, acryloxy, acetate, SH, an alkylthiol, sulfonate, methanosulfonate, and cyanide, and salts thereof.

Herein, an organic group describes a group that is bonded to the silicon in Formula I through a carbon atom.

The organic compound may either be provided in neat liquid form or in solution. It will be understood that, although a compound with Formula I may be provided for reaction with the dielectric surface, hydrolysis at the silicon atom bearing the functional group(s) may often occur in solution by reaction with water. In this case, it will be appreciated that it is not the compound shown by Formula I which undergoes actual reaction with the surface. Instead it may be a compound containing Si—OH bonds, or oligomers of Formula I, in which molecules have reacted to create Si—O—Si bonds. The present invention therefore also provides the in situ reaction of compounds having Formula I with water, followed by reaction of the hydrolysis products of Formula I with the dielectric surface.

Functionalization of the dielectric surface by reacting the dielectric surface with the organic compound may serve to reduce the number and/or the effect of the defects on the dielectric surface. Accordingly, the functionalization may reduce the reactivity of the dielectric surface and defects contained on the surface. The functionalization may sterically shield the surface and the defects. These two effects may contribute to a further reduction in the rate of deposition of the capping layer onto the dielectric surface, thereby increasing the selectivity of the deposition process. The functionalization may also serve to modify the surface properties of the dielectric surface. This may not only be result of the steric shielding and a change of reactivity, but may also be a result of a change of, for example, the wetting properties of the surface. Accordingly, the functionalization can result in a reduced rate of deposition of contaminants onto the dielectric surface. The functionalization of the dielectric surface may also serve as an initial cleaning process before the deposition of the capping layer, displacing impurities already on the dielectric surface. For example, impurities remaining on the surface after the deposition of the interconnect material may be removed. These impurities may include, for example, residues, such as silica residues or carbon residues, remaining on the surface if the surface has undergone polishing prior to the deposition of the capping layer.

Functionalization of the dielectric surface will typically involve depositing the organic compound on the dielectric surface with the formation of chemical bonds between the compound and the surface. It is also possible that physical interaction may occur, such as through hydrogen bonding, electrostatic interactions or even van der Waals interactions may be formed, either independently of any chemical bonds or in conjunction therewith.

The functional groups in Formula I may also be described as leaving groups. Although not wishing to be limited by theory, reaction of the organosilicon compound with the surface will usually proceed with the nucleophilic substitution of the leaving group by either water, a nucleophilic catalyst, or by the hydroxyl groups of the surface itself. Therefore, in this case, a leaving group is preferably defined as a group that is able to be displaced by a nucleophile under the reaction conditions.

In the present invention the functional group(s) in respect of X and optionally $Y_1$ and optionally $Y_2$ in formula (I) is/are independently selected from $NH_2$, a secondary amine, a tertiary amine, acetamide, trifluoroacetamide, imidazole, urea, OH, an alkyoxy, acryloxy, acetate, SH, an alkylthiol, sulfonate, methanosulfonate, and cyanide, and salts thereof.

The selection of the functional groups in Formula I, for example $NH_2$, has been found to lead to a sufficient rate of reaction with the dielectric surface for practical applications. In contrast, some other functional groups, such as halogens (eg chlorine), may exhibit a relatively slow rate of reaction with the surface. A slow rate of reaction is undesirable for practical applications since it increases the processing time and reduces the efficiency of the overall production process. Furthermore, a halogen functional group, for example chlorine, may result in the formation of undesirable by-products, which may necessitate further processing steps.

The consideration of the rate of reaction is especially important when certain preferred methods of applying the solution to the surface are considered. For example, a fast reaction time is especially required in an application where the organosilicon compound is sprayed, either in neat form or in solution, onto the surface of the dielectric. This is the case because it is expected that the reaction solvent may quickly evaporate from the dielectric surface.

Gas phase functionalization of a surface by an organosilicon compound involves intricate apparatus and the need for very carefully controlled reaction conditions. However, the present inventors have found that, for this pre-treatment step prior to the deposition of a capping layer on a conducting interconnect, liquid phase processing may be a much more practical technique for processing a substrate. This is because it may be carried out in the same apparatus as the deposition of the capping layer, and therefore removes the need for specialized apparatus for the functionalization of the surface.

Advantageously, the functional group X and optionally $Y_1$ and/or $Y_2$ are independently selected from a primary amine, secondary amine, and tertiary amine, including salts thereof.

In a preferred embodiment, $Y_1$ is a functional group, and the functional group comprises an amino group or protonated derivative thereof. In a preferred embodiment, the organic compound comprises a reactive organofunctional siloxane oligomer, which may be provided in water.

In another preferred embodiment, $Y_1$ and $Y_2$ are independently selected organic groups and/or organosiloxane groups, so that a total of three independently selected organic groups and/or organosiloxane groups are attached to the silicon. This may be advantageous since it may provide enhanced shielding of the surface.

Preferably, the silicon in the organosilicon compound bears two independently selected functional groups and two independently selected organic groups and/or organosiloxane groups. In another embodiment, the silicon bears one functional group and three independently selected organic groups and/or organosiloxane groups. These embodiments are considered advantageous, as having two or more organic and/or organosiloxane groups attached to the silicon may be able to better shield the defects on the surface. In other words, the steric bulk of the organic and/or organosiloxane groups may be advantageous, and therefore the incorporation of more organic and/or organosiloxane groups onto the silicon may enhance the steric shielding of the surface. This may help protect and reduce the reactivity of any nucleation sites on the surface. Furthermore, by incorporating two or more organic and/or organosiloxane groups onto the silicon, the surface may be more able to repel water than with only one organic group. Hydration of the surface and bulk is kept to a minimum, and therefore, as described below, the dielectric constant of the dielectric layer is also kept to a minimum.

In addition, at least one of the organic groups preferably contains a branching point, such as in a tert-butyl group. These groups are thought to provide an 'umbrella' for the dielectric surface, thereby providing enhanced protection of the defects on the surface. Additional protection of the dielectric surface may be provided by groups containing two or more branching points, such as by a 2,2,3-trimethylbutyl group.

Preferably, the organosiloxane is an organosiloxane oligomer or organosiloxane polymer. More preferably, it has the general formula:

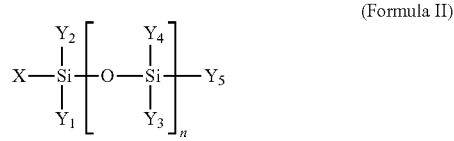

(Formula II)

where $Y_1, Y_2, Y_3, Y_4$ and $Y_5$ are independently selected functional groups as defined in claim 1 and/or organic groups, and n is a positive integer.

Preferably, n is in the range of 1 to 20. More preferably, n is in the range of 1 to 5.

Examples of organosilicon compounds include: hexamethyl-disilazane, trimethyldimethylaminosilane, dimethyl-t-butyldimethylaminosilane, and bi-functional dimethylbis(dimethylamino)silane. Examples of water soluble organosilanes include Dynasylan HS2627 and HS2909, supplied from Degussa. These are organo amino-silanes further comprising organo groups. A further example is Silicad from Gelest, Inc., which has the chemical formula $C_{18}H_{37}Si(OH)_3$.

Nucleophilic catalysts may also be added to the reaction solution. Examples of additives include methanol, ethanol, ammonia and pyridine. These may also be added to enhance the solubility of the organosilicon compound.

Advantageously, R and optionally one or both of $Y_1$ and $Y_2$ is/are independently selected from the following organic groups or organosiloxanes: a organosiloxane oligomer, a organosiloxane polymer, C1-C25 alkyl, C2 to C25 alkenyl, C2 to C25 alkynyl, aryl, aryl substituted with one or more of C1-C25 alkyl, C2-C25 alkenyl and/or C2-C25 alkynyl. Any of these may be partially or fully halogenated. Preferably, R and optionally one or both of $Y_1$ and $Y_2$ is/are independently selected from methyl, ethyl, propyl, butyl, phenyl, pentafluorophenyl, 1,1,2-trimethylpropyl (thexyl) and allyl. Again, any of these may be partially or fully halogenated.

The dielectric surface preferably contains hydroxyl groups or groups that hydrolyze in an ambient aqueous environment to produce hydroxyl groups. In this case, the functionalization of the dielectric surface preferably involves interaction, preferably reaction, of the surface groups.

Accordingly, the present invention is able to provide a further advantage. It is often the case that the dielectric constant of the surface is greater than that of the bulk. One reason for this may be the presence of hydroxyl groups on the surface of the dielectric. These hydroxyl groups may result in the favourable absorption of water onto the surface. The absorbed water is believed to lead to an increased dielectric constant at the surface. In addition, if the dielectric comprises a porous material, then the water molecules may absorb into the bulk material through the penetration of pores, causing an increase in the bulk dielectric constant. Therefore, by functionalizing the surface through interaction or reaction of the hydroxyl groups, the absorption of water onto the surface may become less favoured, thereby reducing the surface dielectric constant. If the dielectric layer is porous, then the functionalization may also keep to a minimum the increase in the bulk dielectric constant due to the absorption of water.

In the case of a silicon-oxide-containing material, surface hydroxyl groups are generated by the break up or hydrolysis of Si—O—Si (siloxane) bonds at the surface of the material by reaction with moisture. These bonds are usually strained since they are typically part of four- or six-membered siloxane rings. In addition, in other materials, such as metal oxides, hydroxyl groups may also be formed at the surface by reaction with moisture.

Hydration of the surface, and hydration of the bulk material in the case of a porous dielectric, is a particularly relevant issue. An advantage of the present invention is that it is able to address certain problems associated with hydration. Firstly, when the surface undergoes polishing prior to the formation of the capping layer, this is usually carried out in the presence of a water-based slurry. Therefore the treatment of the surface with an organic compound which interacts or reacts with the surface hydroxyl groups may also serve to dehydrate the surface at the same time (by reaction with absorbed water), and it may also lead to the dehydration of the bulk material. In this way, the dielectric constant of the dielectric material may advantageously be reduced.

Secondly, if the capping layer is deposited onto the conducting interconnect from an aqueous solution, the presence of an organic layer on the dielectric surface may reduce the rate of, or prevent, water absorption onto the dielectric surface during the deposition process. This again may keep the dielectric constant of the dielectric surface and the dielectric bulk to a minimum.

This may have the additional advantage of widening the range of methods that can be used to process a semiconductor device, in particular a semiconductor device containing a porous dielectric. Therefore Chemical Mechanical Polishing and electro-less deposition may be used now without the need to take any steps to minimize hydration of the surface during these processes.

Preferably, the process for the formation of the capping layer further comprises, prior to the step of functionalizing the upper surface of the dielectric layer, the step of polishing the upper surface of the conductors so that said surface is substantially co-planar with the upper surface of the dielectric. The step of polishing the upper surface of the one or more conductor(s) preferably comprises the conventional technique of chemical mechanical polishing (CMP). In this case, the pre-treatment of the dielectric surface prior to deposition of the capping layer has the further advantage that it may lead to the displacement of residuals remaining on the surface after polishing.

The one or more conductors preferably comprise Cu or an alloy thereof. Alternatively, or in conjunction, Ag or an alloy thereof may be used.

The dielectric layer preferably comprises an oxide of silicon or a carbonated oxide of silicon. Suitable examples include silicon dioxide or carbonated silicon dioxide. The dielectric layer may be a porous or non-porous layer.

The capping layer will typically comprise a metal, typically a metal alloy, preferably a ternary alloy, composition comprising, for example, one or more of Co, Ni, W, Mo, B, P and Sn. Suitable examples include CoP, CoB, CoWP, CoWB, CoMoB, CoWBP, NiP, NiB, NiMoP, and CoSnP.

The capping layer is preferably deposited by a process comprising electro-less deposition. The process is selective, so that the capping layer is essentially only deposited on the interconnect structure and not on the dielectric surface. The process involves placing the surface containing the interconnects into a solution of the salts of the various metals to be incorporated into the alloy capping layer. A reducing agent is usually incorporated into the solution. It is thought that the reducing agent may facilitate the reduction of the metal salts to the metal. An acid or base which alters the pH of the solution may also be added to the solution. In addition, a salt may be added to buffer the solution. Surfactants and/or complexing agents can also be incorporated into the plating solution.

A solution for the electroless deposition of CoWP may, for example, comprise a tungstate salt ($WO_4^{2-}$), such as a sodium salt, an ammonium salt or the tetramethylammonium salt; a cobalt salt, such as a chloride or sulphate; a hypophosphite, such as a sodium salt, an ammonium salt or the tetramethylammonium salt; EDTA may be added as a complexing agent; and tetra-methyl-ammonium-hydroxide may be added to alter the pH. Citrate ions may be added to buffer the solution. Each of these components are added to the solution in a proportion in the range of 5 to 100 g per litre of water solvent. In addition, a surfactant may be added at a lower concentration, such as in the range of 0.1 to 5 g per litre of solution. Preferably, the reaction solution is kept in the temperature range 40 to 90° C., more preferably between 45 and 60° C. The pH of the solution may be between 8.5 and 13, preferably between 8.5 and 9.5. Further details of techniques for electroless deposition for metallic cap layers can be found in *Electrochim. Acta* 44, 3639-3649 (1999).

When reaction of the dielectric surface with the organosilane is carried out in solution, care may need to be taken in order to avoid excessive polymerization of the reactant. Excessive polymerization is characterized by the reaction solution turning cloudy. Polymerization is, for example, favoured by a high concentration of reactant. Therefore, the concentration of the compound having Formula I, or its hydrolysis product, is preferably in the range of $10^{-4}$ to $10^{-2}$ moldm$^{-3}$.

Other favoured reaction conditions include a reaction temperature of from 20 and 85° C., preferably 20 to 50° C. The length of time that the dielectric layer is left exposed to the reaction solution is preferably up to 240 minutes; more preferably up to 30 minutes; more preferably between 20 seconds and 5 minutes; and more preferably up to 2 minutes.

The compounds having Formula I may also be applied to the surface by spraying. More particularly, the compounds may be dissolved in an organic solvent and sprayed onto the surface, or the compounds may be applied to the surface in neat form. Preferably, the compounds may be sprayed onto the surface in an inert atmosphere. The inert atmosphere should principally contain very little or no moisture (e.g. preferably <1% humidity). In addition, the inert atmosphere may contain one or more the following gasses: argon, nitrogen, and/or carbon dioxide.

Functionalization may also be achieved by the Langmuir-Blodgett technique.

The organosilicon compound may be added either in a solution by itself, or in a solution containing additives. In either case, the treatment of the surface with the solution containing the organic component may precede, or be preceded by, or both be preceded by and precede, the cleaning of the surface. This cleaning (or washing) may include either one or two steps:
  a) treatment with an inorganic acid or inorganic base, such as ammonium persulfate, ammonium phosphate, ammonium fluoride or ammonium hydroxide;
  b) treatment with an organic acid or an organic base, such as citric acid, oxalic acid, malic acid, acetic acid, tartaric acid, tetramethylammonium hydroxide, tetraethylammonium hydroxide, aminoethanol.

These steps may be carried out either in order (i.e. step a followed by step b), or in reverse (i.e. step b followed by step a), or one can be carried out before treatment step of the present invention with the organic component, and the other after, or with one or both steps before, or with one or both steps after.

In a preferred embodiment, steps a and b are carried out prior to the treatment of the surface with a solution containing only an organic component, more preferably an organosilicon compound, such as that with the structure of Formula I, to functionalize the dielectric surface.

The pre-treatment solution may comprise one of or more of water and an organic solvent. Preferably, especially when the pre-treatment solution is water-based, a co-solvent is included. The co-solvent may enhance the solubility of the components of the solution, such as the surfactant. In addition, the co-solvent may allow the reaction solution, and the distribution of the components in the solution, to be more homogenous compared to without the presence of the co-solvent. Preferably, the co-solvent is an alcohol, more preferably it is ethanol and/or isopropyl alcohol (IPA).

In addition to the component having Formula I, the pre-treatment solution may also include a number of other additives.

For example, the solution may include complexing agents, such as EDTA (ethylenediaminetetraacetic acid), or a derivative or salt thereof. Complexing agents are able to help the removal of any metallic species absorbed onto the surface. The organic acid may also act as a complexing agent.

The pre-treatment solution may also include surfactants to aid the wetting of the pre-treatment solution onto the surface, to aid the solubility of various of the components in solution, and/or to help clean the surface. A wide variety of surfactants may be used. It may be advantageous to use a block co-polymer of poly(ethyleneoxide) and poly(propylene)oxide. These two groups are efficiently absorbing on both hydrophobic and hydrophilic surfaces, and the length and ratio of each group present in the block co-polymer can be easily tailored to the application.

The pre-treatment solution may be either acidic or basic. In the case where neither steps a or b described above are carried out before or after treatment of the surface with this pre-treatment solution, the pre-treatment solution preferably has a pH of less than 3. Accordingly, the pre-treatment solution may include an acid, preferably an organic acid, for example citric and/or malic acid. The pre-treatment solution may also include an inorganic acid, for example an ammonium salt, such as ammonium persulfate.

It will be apparent from the foregoing that the present invention provides a pre-clean step for selective electroless deposition in semiconductor fabrication.

In a second aspect, the present invention provides a process for the formation of a capping layer on a conducting interconnect for a semiconductor device, the process comprising the steps of:
  providing one or more conductors in a dielectric layer, the one or more conductors comprising Cu or an alloy thereof, the dielectric layer comprising Si or an oxide or carbonated oxide thereof, and
  depositing a capping layer on an upper surface of the one or more conductors,
  characterised in that, prior to depositing the capping layer, the process further includes the step of reacting an upper surface of the dielectric layer with a reactive organofunctional organosiloxane oligomer.

The reactive organofunctional siloxane oligomer may be provided in the presence of water.

The features described above in relation to the first aspect are also applicable to the second aspect, either singularly or in combination.

In a third aspect, the present invention provides a conducting interconnect for a semiconductor device obtainable by a process as herein described.

In a fourth aspect, the present invention provides a conducting interconnect for a semiconductor device, comprising: (i) a dielectric layer having one or more conductors provided in an upper surface thereof, said upper surface being functionalized so as to reduce the number and/or the effect of any defects on the dielectric surface or to modify the surface properties of the dielectric surface, and (ii) a capping layer provided on an upper surface of at least some of the one or more conductors.

In a fifth aspect, the present invention provides a semiconductor device comprising a conducting interconnect as herein described.

In a sixth aspect, the present invention provides for the use of an organic compound to functionalise a dielectric layer having one or more conductors on a surface thereof, wherein said use comprises reacting the organic compound with the dielectric layer prior to deposition of a capping layer on an upper surface of at least some of the one or more conductors, and wherein said organic compound has the following general formula:

(Formula I)

where X is a functional group, R is an organic group or a organosiloxane group, $Y_1$ is either a functional group or an organic group or organosiloxane group, and $Y_2$ is either a functional group or an organic group or organosiloxane group, and where the functional group(s) is/are independently selected from the following: $NH_2$, a secondary amine, a tertiary amine, acetamide, trifluoroacetamide, imidazole, urea, OH, an alkyoxy, acryloxy, acetate, SH, an alkylthiol, sulfonate, methanosulfonate, and cyanide, and salts thereof.

The features described above in relation to the first aspect are equally applicable to the second, third, fourth, fifth and sixth aspects, either singularly or in combination.

EXAMPLES

The present invention will now be illustrated further with reference to the following non-limiting examples.

Comparative Example 1

A conventional array of copper interconnects on a silicon dioxide surface was provided after Chemical Mechanical Polishing. A solution containing 20 g citric acid, 20 g malic acid and 20 g ammonium persulfate in 1 litre of water was prepared. The pH of the solution was measured to be between 2.8 and 2.9. The silicon dioxide/copper interconnect surface was immersed in this solution at 22° C. for 2 minutes in a beaker. The surface was then transferred into a solution for the electroless deposition of a capping layer, as described in patent application number US2005/0048773 (U.S. Pat. No. 6,924,232) in the name of Freescale. The solution was treated for 50 seconds at 55° C., and then removed from the solution, and allowed to dry.

A photograph of the surface is shown in FIG. 1. Portions on the dielectric surface onto which the capping layer has been deposited are clearly visible as spots of darker material on the lighter dielectric surface. It is thought that this unselective deposition of the capping layer is a result of residuals on the dielectric surface.

Example 1

A conventional array of copper interconnects on a silicon dioxide surface was provided after Chemical Mechanical Polishing. A solution containing 20 g citric acid, 20 g malic acid and 20 g ammonium persulfate in 1 litre of water was prepared. To this was added 0.5 wt % Sivento Dynasylan HS2627. Sivento Dynasylan HS2627 was supplied by Degussa, and it is known to be a siloxane oligomer that is soluble in water. This siloxane oligomer further comprises an amino functional group and organic groups attached to silicon. The pH of the solution was measured to be 2.9. The silicon dioxide/copper interconnect surface was immersed in this solution at 22° C. for 2 minutes in a beaker. The surface was then transferred into a solution for the electroless deposition of a capping layer, as described in patent application number US20050048773 in the name of Freescale. The solution was treated for 50 seconds at 55° C., and then removed from the solution, and allowed to dry.

Figure 2:
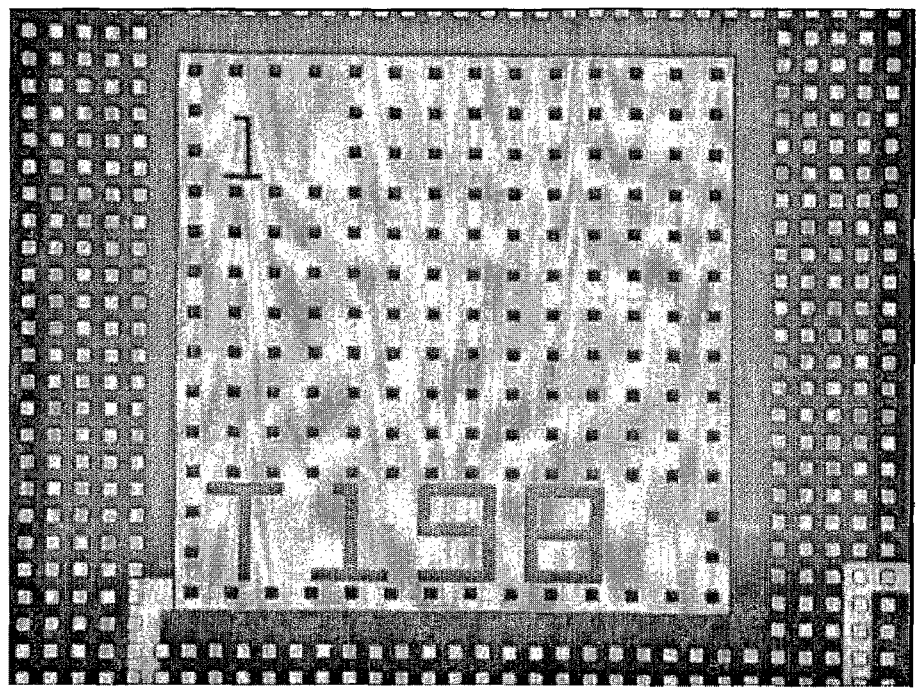

A photograph of the surface is shown in FIG. 2. Unlike for the comparative example 1, a clean surface is observed, indicating a much more selective deposition of the capping layer than in the case of the comparative example.

The invention claimed is:

1. A process for the formation of a capping layer on a conducting interconnect for a semiconductor device, the process comprising the steps of:
   providing one or more conductors in a dielectric layer; and
   depositing a capping layer on an upper surface of at least some of the one or more conductors, characterised in that the process further includes:
   the step of, prior to depositing the capping layer, reacting the dielectric layer with an organic compound in a liquid phase, the said organic compound having the following general formula:

(Formula I)

wherein X is a functional group, R is an organosiloxane group, $Y_1$ is a functional group or an organic group or organosiloxane group, and $Y_2$ is a functional group or an organic group or organosiloxane group and wherein the functional group (s) is/are independently selected from the following: a secondary amine, a tertiary amine, acetamide, trifluoroacetamide, imidazole, urea, an alkyoxy, acryloxy, acetate, SH, an alkylthiol, sulfonate, methanosulfonate, and cyanide, and salts thereof; and
   wherein at least one of the organic groups contains one or more branching points.

2. A process as claimed in claim 1, wherein, prior to the step of reacting the dielectric layer with the organic compound, the process furthers comprises the step of polishing the upper surface of the one or more conductors so that said surface is substantially co-planar with the upper surface of the dielectric.

3. A process as claimed in claim 2, wherein the step of polishing the upper surface of the one or more conductors comprises chemical mechanical polishing (CMP).

4. A process as claimed in claim 1, wherein the one or more conductors comprises Cu or an alloy thereof or Ag or an alloy thereof.

5. A process as claimed in claim 1, wherein the dielectric layer comprises an oxide of silicon or a carbonated oxide of silicon.

6. A process as claimed in claim 5, wherein the dielectric layer comprises silicon dioxide or carbonated silicon dioxide.

7. A process as claimed in claim 1, wherein the dielectric layer is a porous layer.

8. A process as claimed in claim 1, wherein the capping layer comprises an alloy.

9. A process as claimed in claim 1, wherein the capping layer is deposited by electroless deposition.

10. A process as claimed in claim 1, wherein R and optionally one or both of $Y_1$ and $Y_2$ is/are independently selected from the following organic and organosiloxane groups: a organosiloxane oligomer, or organosiloxane polymer, C1-C25 alkyl, C2 to C25 alkenyl, C2 to C25 alkynyl, aryl, aryl substituted with one or more of C1-C25 alkyl, C2-C25 alkenyl and/or C2-C25 alkynyl.

11. A process as claimed in claim 1, wherein R is an organosiloxane oligomer or organosiloxane polymer, wherein the organic compound including the organosiloxane oligomer or organosiloxane polymer has the general formula:

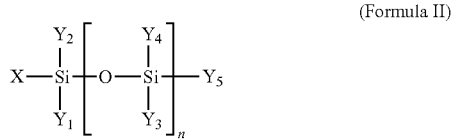

(Formula II)

wherein n is a positive integer, and wherein $Y_1$ is a functional group or an organic group, $Y_2$ is a functional group or an organic group, $Y_3$ is a functional group or an organic group, $Y_4$ is a functional group or an organic group, and $Y_5$ is a functional group or an organic group, and wherein the functional group (s) is/are independently selected from: a secondary amine, a tertiary amine, acetamide, trifluoroacetamide, imidazole, urea, an alkyoxy, acryloxy, acetate, SH, an alkylthiol, sulfonate, methanosulfonate, and cyanide, and salts thereof.

12. A process as claimed in claim 11, wherein n is in the range of 1 to 20.

13. A process as claimed in claim 12, wherein n is in the range of 1 to 5.

14. A process as claimed in claim 1, wherein at least one of the organic groups contains at least two branching points.

15. A process as claimed in claim 1, wherein the compound having Formula I is hydrolyzed prior to reaction with dielectric surface.

16. A process as claimed in claim 1, wherein the step of reacting the dielectric surface with the organic compound is carried out in a solvent comprising an organic solvent.

17. A process claimed in claim 1, wherein the step of reacting the dielectric surface with the organic compound is carried out in a solvent comprising water.

18. A process as claimed in claim 1, wherein the step or reacting the dielectric surface with the organic compound is carried out in a solution comprising an acid and/or a surfactant.

19. A conducting interconnect for a semiconductor device obtainable by a process as defined in claim 1.

20. A process as claimed in claim 1, wherein $Y_1$ is a functional group.

21. A process as claimed in claim 20, wherein the functional groups are independently selected from: a secondary amine, a tertiary amine, and salts thereof.

22. A process for the formation of a capping layer on a conducting interconnect for a semiconductor device, the process comprising the steps of: providing one or more conductors in a dielectric layer, the one or more conductors comprising Cu or an alloy thereof, the dielectric layer comprising Si or an oxide or carbonated oxide thereof, and depositing a capping layer on an upper surface of the one or more conductors, characterized in that, prior to depositing the capping layer, the process further includes the step of reacting an upper surface of the dielectric layer with an organic compound including a reactive organofunctional organosiloxane oligomer, said organic compound having the following general formula: wherein X is a functional group, R is an organosiloxane group, Y1 is a functional group or an organic group or organosiloxane group, and Y2 is a functional group or an organic group or organosiloxane group and wherein the functional group (s) is/are independently selected from the following: a secondary amine, a tertiary amine, acetamide, trifluoroacetamide, imidazole, urea, an alkyoxy, acryloxy, acetate, SH, an alkylthiol, sulfonate, methanosulfonate, and cyanide, and salts thereof.

23. A process as claimed in claim 22, wherein the reactive organofunctional organosiloxane oligomer is provided in the presence of water.

24. A conducting interconnect for a semiconductor device, comprising:
(i) a dielectric layer having one or more conductors provided in an upper surface thereof, said upper surface being functionalized by reacting the dielectric surface with an organic compound in a liquid phase, the said organic compound having the following general formula:

(Formula I)

wherein X is a functional group, R is an organosiloxane group $Y_1$ is either a functional group or an organic group or organosiloxane group, and $Y_2$ is either a functional group or an organic group or organosiloxane group, and wherein the functional group (s) is/are independently selected from: a secondary amine, a tertiary amine, acetamide, trifluoroacetamide, imidazole, urea, an alkyoxy, acryloxy, acetate, SH, an alkylthiol, sulfonate, methanosulfonate, and cyanide, and salts thereof, and wherein at least one of the organic groups contains one or more branching points; and
(ii) a capping layer provided on an upper surface of at least some of the one or more conductors.

25. A conducting interconnect as claimed in claim 24, wherein the organic compound is a reactive organofunctional siloxane oligomer.

26. A conducting interconnect as claimed in claim 24, wherein the one or more conductors comprises Cu or an alloy thereof or Ag or an alloy thereof.

27. A conducting interconnect as claimed in claim 24, wherein the dielectric layer comprises an oxide of silicon or a carbonated oxide of silicon.

28. A conducting interconnect as claimed in claim 27, wherein the dielectric layer comprises silicon dioxide or carbonated silicon dioxide.

29. A conducting interconnect as claimed in claim 24, wherein the dielectric layer is a porous layer.

30. A conducting interconnect as claimed in claim 24, wherein the capping layer comprises an alloy.

31. A conducting interconnect as claimed in claim 30, wherein the capping layer comprises a ternary alloy composition.

32. A conducting interconnect as claimed in claim 31, wherein the ternary alloy composition comprises one or more of Co, Ni, Mo, B, P and Sn.

33. A conducting interconnect as claimed in claim 24, wherein the capping layer is an electroless deposited capping layer.

34. A semiconductor device comprising a conducting interconnect as defined in claim 25.

35. A conducting interconnect as claimed in claim 24, wherein $Y_1$ is a functional group, and wherein the functional groups are independently selected from: a secondary amine, a tertiary amine, and salts thereof.

36. Use of an organic compound to functionalize a dielectric layer having one or more conductors on a surface thereof, wherein said use comprises reacting the organic compound with the dielectric layer prior to deposition of a capping layer on an upper surface of at least some of the one or more conductors, and wherein said organic compound has the following general formula:

(Formula I)

wherein X is a functional group, R is an organosiloxane group, $Y_1$ is either a functional group, and $Y_2$ is either a functional group or an organic group or organosiloxane group, and wherein the functional groups are independently selected from: $NH_2$, a secondary amine, a tertiary amine, acetamide, trifluoroacetamide, imidazole, urea, OH, an alkyoxy, acryloxy, acetate, SH, an alkylthiol, sulfonate, methanosulfonate, and cyanide, and salts thereof; and wherein at least one of the organic groups contains one or more branching points.

* * * * *